(12) United States Patent
Blodgett et al.

(10) Patent No.: US 8,164,368 B2
(45) Date of Patent: Apr. 24, 2012

(54) POWER SAVINGS MODE FOR MEMORY SYSTEMS

(75) Inventors: Greg A. Blodgett, Nampa, ID (US); Tyler Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 990 days.

(21) Appl. No.: 11/109,531

(22) Filed: Apr. 19, 2005

(65) Prior Publication Data

US 2006/0233036 A1  Oct. 19, 2006

(51) Int. Cl.
  *H03L 7/06* (2006.01)
(52) U.S. Cl. .................................. 327/158; 327/544
(58) Field of Classification Search .............. 327/158, 327/544
  See application file for complete search history.

(56) References Cited

U.S. PATENT DOCUMENTS

| | | | | |
|---|---|---|---|---|
| 3,594,656 | A * | 7/1971 | Tsukamoto | 331/49 |
| 5,560,017 | A * | 9/1996 | Barrett et al. | 710/260 |
| 6,070,248 | A * | 5/2000 | Yu et al. | 713/501 |
| 6,072,846 | A * | 6/2000 | Kyung et al. | 375/354 |
| 6,111,448 | A * | 8/2000 | Shibayama | 327/293 |
| 6,294,904 | B1 * | 9/2001 | Hirst | 323/283 |
| 6,370,075 | B1 * | 4/2002 | Haeberli et al. | 365/226 |
| 6,556,489 | B2 | 4/2003 | Gomm et al. | |
| 6,586,979 | B2 | 7/2003 | Gomm et al. | |
| 6,600,345 | B1 * | 7/2003 | Boutaud | 327/99 |
| 6,661,736 | B2 * | 12/2003 | Magoshi | 365/233.14 |
| 6,720,673 | B2 * | 4/2004 | Blanco et al. | 307/64 |
| 6,727,734 | B2 | 4/2004 | Gomm | |
| 6,728,163 | B2 | 4/2004 | Gomm et al. | |
| 6,735,148 | B2 | 5/2004 | Gomm | |
| 6,737,897 | B2 | 5/2004 | Gomm et al. | |
| 6,759,883 | B2 | 7/2004 | Gomm | |
| 6,759,911 | B2 | 7/2004 | Gomm et al. | |
| 6,760,262 | B2 * | 7/2004 | Haeberli et al. | 365/189.09 |
| 6,774,687 | B2 | 8/2004 | Gomm et al. | |
| 6,781,861 | B2 | 8/2004 | Gomm et al. | |
| 6,803,826 | B2 | 10/2004 | Gomm et al. | |
| 6,850,107 | B2 | 2/2005 | Gomm | |
| 6,901,009 | B2 * | 5/2005 | Natori | 365/185.18 |
| 6,989,696 | B2 * | 1/2006 | Hilgendorf et al. | 327/154 |
| 7,042,259 | B2 * | 5/2006 | Kurd et al. | 327/147 |
| 7,046,047 | B2 * | 5/2006 | Daijo | 327/99 |
| 7,046,048 | B2 * | 5/2006 | Starr et al. | 327/99 |
| 7,317,342 | B2 * | 1/2008 | Saint-Laurent | 327/295 |
| 2003/0231042 | A1 | 12/2003 | Lin et al. | |
| 2004/0039955 | A1 | 2/2004 | Gomm | |
| 2004/0044918 | A1 | 3/2004 | Dermott et al. | |
| 2004/0232962 | A1 | 11/2004 | Gomm et al. | |
| 2004/0251936 | A1 | 12/2004 | Gomm | |

* cited by examiner

*Primary Examiner* — Kenneth B. Wells
(74) *Attorney, Agent, or Firm* — Dorsey & Whitney LLP (57) ABSTRACT

A system and method are disclosed to accomplish power savings in an electronic device, such as a memory chip, by performing selective frequency locking and subsequent instantaneous frequency switching in the DLL (delay locked loop) used for clock synchronization in the electronic device. By locking the DLL at a slow clock frequency, the operational frequency may be substantially instantaneously switched to an integer-multiplied frequency of the initial locking frequency without losing the DLL lock point. This DLL locking methodology allows for faster frequency changes from higher (during normal operation) to lower (during a power saving mode) clock frequencies without resorting to gradual frequency slewing to conserve power and maintain DLL locking. Hence, a large power reduction may be accomplished substantially instantaneously without adding complexity to the system clock generator. Because of the rules governing abstracts, this abstract should not be used in construing the claims.

10 Claims, 5 Drawing Sheets

POWER SAVINGS MODE FOR MEMORY SYSTEMS

BACKGROUND

1. Field of the Disclosure

The present disclosure generally relates to synchronous circuits and, more particularly, to a delay locked loop (DLL) locking mechanism for power savings or other types of low frequency modes of operation in memory systems and other electronic devices.

2. Brief Description of Related Art

Most digital logic implemented on integrated circuits is clocked synchronous sequential logic. In electronic devices such as synchronous dynamic random access memory circuits (SDRAMs), microprocessors, digital signal processors, etc., the processing, storage, and retrieval of information is coordinated or synchronized with a clock signal. The speed and stability of the clock signal determines to a large extent the data rate at which a circuit can function. Many high speed integrated circuit devices, such as SDRAMs, microprocessors, etc., rely upon clock signals to control the flow of commands, data, addresses, etc., into, through and out of the devices.

In SDRAMs or other semiconductor memory devices, it is desirable to have the data output from the memory synchronized with the system clock that also serves the microprocessor. Delay locked loops (DLLs) are synchronous circuits used in SDRAMs to synchronize an external clock (e.g., the system clock serving a microprocessor) and an internal clock (e.g., the clock used internally within the SDRAM to perform data read/write operations on various memory cells) with each other. Typically, a DLL is a feedback circuit that operates to feed back a phase difference-related signal to control a delay line, until the timing of one clock signal (e.g., the system clock) is advanced or delayed until its rising edge is coincident (or "locked") with the rising edge of a second clock signal (e.g., the memory internal clock). A brief discussion of the operation of a DLL is provided hereinbelow with reference to FIG. 2. However, a brief discussion of a memory device is first provided in conjunction with FIG. 1.

Figure 1:
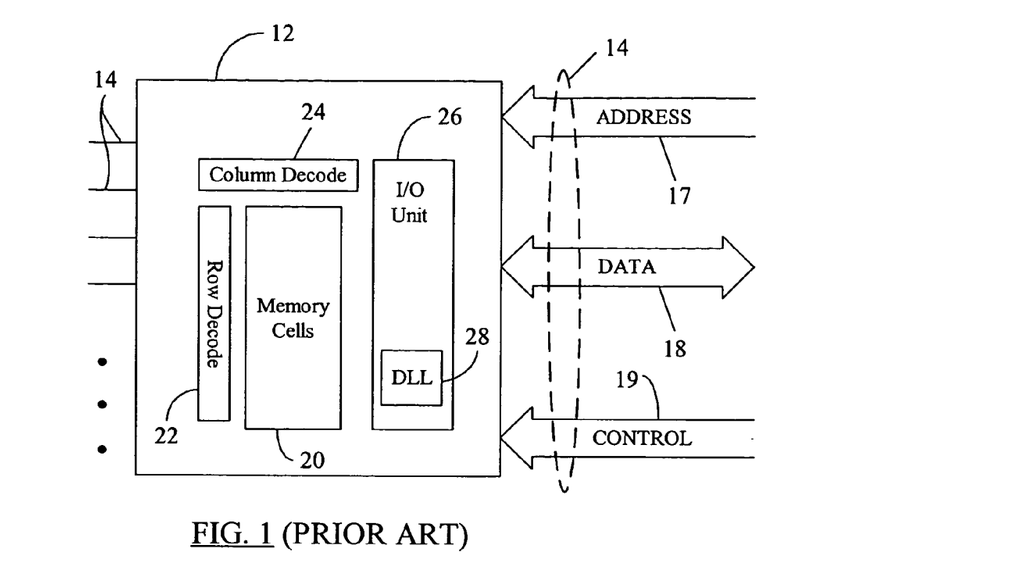
FIG. 1 is a simplified block diagram showing a memory chip or memory device.

FIG. 1 is a simplified block diagram showing a memory chip or memory device 12. The memory chip 12 may be part of a DIMM (dual in-line memory module) or a PCB (printed circuit board) containing many such memory chips (not shown in FIG. 1). The memory chip 12 may include a plurality of pins 14 located outside of chip 12 for electrically connecting the chip 12 to other system devices. Some of those pins 14 may constitute memory address pins or address bus 17, data pins or data bus 18, and control pins or control bus 19. It is evident that each of the reference numerals 17-19 designates more than one pin in the corresponding bus. Further, it is understood that the schematic in FIG. 1 is for illustration only. That is, the pin arrangement or configuration in a typical memory chip may not be in the form shown in FIG. 1.

A processor or memory controller (not shown) may communicate with the chip 12 and perform memory read/write operations. The processor and the memory chip 12 may communicate using address signals on the address lines or address bus 17, data signals on the data lines or data bus 18, and control signals (e.g., a row address strobe (RAS) signal, a column address strobe (CAS) signal, etc. (not shown)) on the control lines or control bus 19. The "width" (i.e., number f pins) of address, data and control buses may differ from one memory configuration to another. Additionally, in some circuit architectures, the bus may be time multiplexed such that at one point in time the bus carries address information while at another point in time the same bus carry control signals, and at yet another point in time the same bus carries data signals.

Those of ordinary skill in the art will readily recognize that memory chip 12 of FIG. 1 is simplified to illustrate one embodiment of a memory chip and is not intended to be a detailed illustration of all of the features of a typical memory chip. Numerous peripheral devices or circuits may be typically provided along with the memory chip 12 for writing data to and reading data from the memory cells 20. However, these peripheral devices or circuits are not shown in FIG. 1 for the sake of clarity.

The memory chip 12 may include a plurality of memory cells 20 generally arranged in rows and columns to store data in rows and columns. Each memory cell 20 may store a bit of data. A row decode circuit 22 and a column decode circuit 24 may select the rows and columns in the memory cells 20 in response to decoding an address, provided on the address bus 17. Data to/from the memory cells 20 is then transferred over the data bus 18 via sense amplifiers and a data output path (shown generally as I/O unit 26). A memory controller (not shown) may provide relevant control signals (not shown) on the control bus 19 to control data communication to and from the memory chip 12 via the I/O (input/output) unit 26. The I/O unit 26 may include a number of data output buffers to receive the data bits from the memory cells 20 and provide those data bits or data signals to the corresponding data lines in the data bus 18. The I/O unit 26 may further include a clock synchronization unit or delay locked loop (DLL) 28 to synchronize the external system clock (e.g., the clock used by the memory controller (not shown) to clock address, data and control signals between the memory chip 12 and the controller) with the internal clock used by the memory 12 to perform data write/read operations on the memory cells 20.

The memory controller (not shown) may determine the modes of operation of memory chip 12. Some examples of the input signals or control signals (not shown in FIG. 1) on the control bus 19 include an External Clock signal, a Chip Select signal, a Row Address Strobe signal, a Column Address Strobe signal, a Write Enable signal, etc. The memory chip 12 communicates to other devices connected thereto via the pins 14 on the chip 12. These pins, as mentioned before, may be connected to appropriate address, data and control lines to carry out data transfer (i.e., data transmission and reception) operations.

Figure 2:
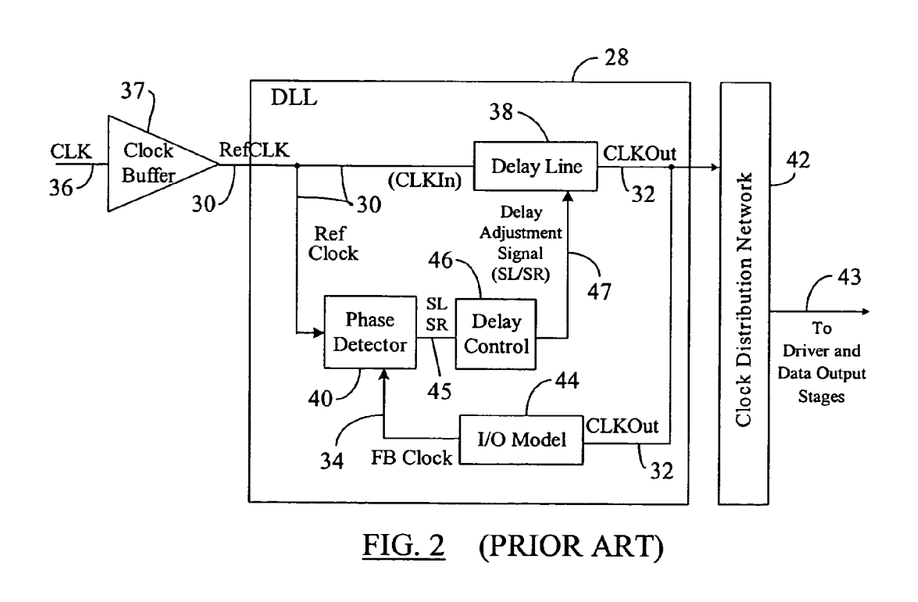
FIG. 2 is a simplified block diagram of the delay-locked loop shown in FIG. 1.

FIG. 2 depicts a simplified block diagram of the delay locked loop (DLL) 28 shown in FIG. 1. The DLL 28 receives a reference clock (ClkREF) 30 as an input and generates an output clock or the ClkOut signal 32 at its output. A ClkOut signal 32 is, in turn, fed back as a feedback clock (CLkFB) 34 as discussed later. The reference clock 30 is interchangeably referred to herein as "ClkREF", "ClkREF signal", "Ref clock signal" or "Ref clock"; whereas the feedback clock 34 is interchangeably referred to herein as "ClkFB", "ClkFB signal", "FB clock signal" or "FB clock." The reference clock 30 is typically the external system clock or a delayed/buffered version of the external system clock serving the microprocessor. In the embodiment of FIG. 2, the system clock 36 is shown buffered through a clock buffer 37. The output of the clock buffer 37—i.e., the Ref clock 30—thus is a buffered version of the system clock 36. In a register controlled DLL, the Ref clock 30 is input into a bank of registers and delay elements comprising delay line 38 as shown in FIG. 2. The registers in the delay line 38 control the delay elements with phase difference information received from a phase detector 40, as discussed below. For the ease of discussion, the bank of registers and delay elements in FIG. 2 are referred to as "the delay line block" hereinbelow.

The clock output of the delay line block 38—the ClkOut signal 32—is used to provide the internal clock (not shown) used by the SDRAM 12 to transfer the data out of the SDRAM to the data requesting device (e.g., a microprocessor (not shown)). Thus, as shown in FIG. 2, the ClkOut 32 is sent to a clock distribution network or clock tree circuit 42 whose output 43 may be coupled to SDRAM clock driver and data output stages (not shown) in the I/O unit 26 to clock the data retrieval and transfer operations. As can be seen from FIG. 2, the ClkOut signal 32 (and, hence, the FB clock 34) is generated using delay elements in the delay line block 38, which introduces a specific delay into the input Ref clock 30 to obtain the "lock" condition.

As noted before, the purpose of the DLL 28 is to align or lock the memory's 12 internal clock (not shown) to the system's external clock (e.g., the system clock 36). A phase detector (PD) 40 compares the relative timing of the edges of the system clock 36 and the memory's internal clock (not shown) by comparing the relative timing of their respective representative signals—the Ref clock 30 which relates to the system clock 36, and the FB clock signal 34 which relates to the memory's internal clock—so as to establish the lock condition. As shown in FIG. 2, an I/O delay model circuit 44 may be a part of the DLL 28 to function as a buffer or dummy delay circuit for the ClkOut signal 32 before the ClkOut signal 32 is fed into the phase detector 40 as the FB clock 34. It is noted that although the ClkOut signal 32 is shown as an input to the I/O delay model 44, in some practical applications, the CLkOut signal 32 may still be an input to the clock distribution network 42, but another clock signal (not shown) received from the clock distribution network 42 may be fed as an input to the I/O delay model 44 instead of the ClkOut signal 32. In any event, the output of the I/O model 44 (i.e., the FB clock 34) effectively represents the memory's internal clock, which may be provided through the clock driver and data output stages (not shown) in the I/O unit 26. The I/O delay model 44 replicates the intrinsic delay of the clock path, which includes the delay of the system clock input buffer 37 and which includes the delay encountered by the CLkOut signal 32 in the output data path (not shown) in the memory 12 prior to the output of data and/or control signals from the memory. Thus, the I/O model 44 may be a replica of the system clock receiver circuit (not shown) that includes the external clock buffer 37, and the clock and data output path (not shown) so as to match respective delays imparted by these stages to the system clock 36 and the ClkOut signal 32, such that when the Ref clock 30 and the FB clock 34 are in phase, the system clock 36 and the output of the memory are synchronized. Thus, the I/O delay model 44 attempts to maintain the phase relationship between the Ref clock 30 and the FB clock 34 as close as possible.

The Ref clock 30 and the FB clock 34 are fed as inputs into the phase detector 40 for phase comparison. The output of the PD 40—a shift left (SL)/shift right (SR) signal 45—controls the amount of delay imparted to the ClkREF 30 by the delay line block 38. The SL/SR signal 45 may determine whether the Ref clock 30 should be shifted left (SL) or shifted right (SR) through the appropriate delay elements in the delay line block 38 so as to match the phases of the Ref clock 30 and the FB clock 34 to establish the lock condition. In practice, a "lock condition" is established and the DLL 28 is considered "locked" (i.e., the Ref clock 30 and the FB clock 34 are "synchronized") when the rising edges of the Ref clock 30 and the FB clock 34 are substantially aligned. The SL/SR signal 45 may be supplied to the delay line block 38 via a delay control unit 46, which may control the timing of application of the SL/SR signal 45 by generating a delay adjustment signal 47, which, in effect, serves the same purpose as the SL/SR signal 45 but its application to the delay line block 38 is controlled by the delay control unit 46. The delay imparted to the Ref clock 30 by the delay line block 38 operates to adjust the time difference between the output clock (i.e., the FB clock 34) and the input Ref clock 30 until they are aligned or "locked". The phase detector 40 generates the shift left and shift right signals depending on the detected phase difference or timing difference between the Ref clock 30 and the FB clock 34, as is known in the art.

It is observed here that modern electronic devices operate at significantly higher clock speeds than their predecessors. The higher clock speeds also increase power consumption during normal device operations. Thus, to save power when the device is not operating or performing its normal functions, a low power mode or power saving mode is typically provided to conserve system power. For example, in case of a memory device (e.g., the memory chip 12 in FIG. 1), a memory controller (not shown) for the memory device may provide suitable external commands to force the memory device to enter into a low power mode (which may be referred to as a "slumber mode", "sleep mode" or "hibernation mode") when, for example, the memory device is idle or not performing any data read/write operations. In one prior art method, a frequency slewing method is employed to gradually reduce the frequency of the system clock (e.g., the clock 36 in FIG. 2) to the desired low frequency level. During such frequency slewing, the DLL in the memory device operates to gradually establish and maintain the lock between each new system clock 36 and the memory's internal clock so as to provide the reduced clock frequency to memory's internal elements.

However, because of a DLL's presence in the clock circuit portion of an electronic device (to maintain output synchronization with and input clock) frequency slewing may not be an option. For example, if the DLL is at a lock point near the minimum delay, and if the frequency is increased, the DLL will respond by trying to decrease the DLL delay. Once the end of the delay line is reached, the DLL can no longer maintain a lock. As another example, if the frequency is slewed by slowing the clock, the DLL will respond by increasing the amount of delay in the delay line. If the DLL loop delay is a high multiple of the clock period, the maximum delay of the DLL is quickly reached and the DLL is no longer able to maintain lock. Also, the DLL can not reliably respond to rapid changes in clock frequency, so frequency changes must be very slow and limited if allowed at all. Frequency slewing for power reduction is therefore largely limited by fundamental DLL operation.

SUMMARY

According to one embodiment of the present disclosure, a method comprises locking a delayed locked loop at a first clock frequency. The first clock frequency is substantially simultaneously switched to a second clock frequency that is related to the first clock frequency by an integer value (i.e. the first clock frequency is multiplied by or divided by an integer value).

According to another embodiment of the present disclosure, a method comprises locking a delayed locked loop at a first clock frequency. The first clock frequency is switched to a second clock frequency without slewing between the frequencies. The second clock frequency is related to the first clock frequency by an integer value (i.e. the first clock frequency is multiplied by or divided by an integer value).

Various methods of operating a delayed locked loop within an electronic device, or within a memory cell, as well as hardware in the form of a combination of circuits, electronic devices, and systems are also disclosed.

The systems, circuits, and methods of the present disclosure accomplish, for example, power savings in an electronic device, such as a memory chip, by performing selective frequency locking and frequency switching in the DLL (delay locked loop) used for clock synchronization in the electronic device. By locking the DLL at, for example, a slow clock frequency, the operational frequency may be, for example, substantially instantaneously switched to an integer-multiplied frequency of the initial locking frequency without losing the DLL lock point. This allows for faster frequency changes from higher (during normal operation) to lower (during a power saving mode) clock frequencies to conserve power and maintain DLL locking without resorting to gradual frequency slewing. Hence, a large power reduction may be substantially instantaneously accomplished without adding complexity to the system clock generator.

BRIEF DESCRIPTION OF THE DRAWINGS

For the present disclosure to be easily understood and readily practiced, the present disclosure will now be described for purposes of illustration and not limitation, in connection with the following figures, wherein.

DETAILED DESCRIPTION

Reference will now be made in detail to certain embodiments of the present disclosure, examples of which are illustrated in the accompanying figures. It is to be understood that the figures and descriptions of the present disclosure included herein illustrate and describe elements that are of particular relevance to the present disclosure; while eliminating, for the sake of clarity, other elements found in typical solid-state memories or memory-based systems. It is noted at the outset that the terms "connected", "connecting," "electrically connected," etc., are used interchangeably herein to generally refer to the condition of being electrically connected. It is further noted that various block diagrams, circuit diagrams and timing waveforms shown and discussed herein employ logic circuits that implement positive logic, i.e., a high value on a signal is treated as a logic "1" whereas a low value is treated as a logic "0." However, any of the circuits discussed herein may be easily implemented in negative logic (i.e., a high value on a signal is treated as a logic "0" whereas a low value is treated as a logic "1").

Figure 3A:
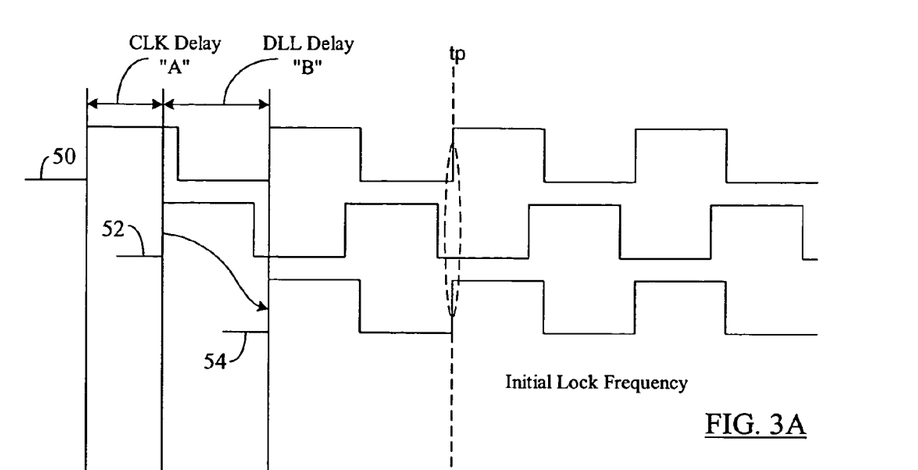
FIGS. 3A-3C illustrate an exemplary DLL locking mechanism through a set of clock signals according to one embodiment of the present disclosure.
Figure 3B:
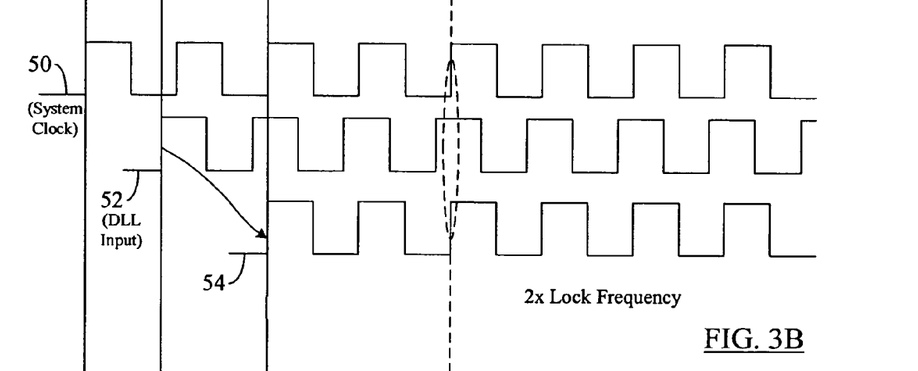
Figure 3C:
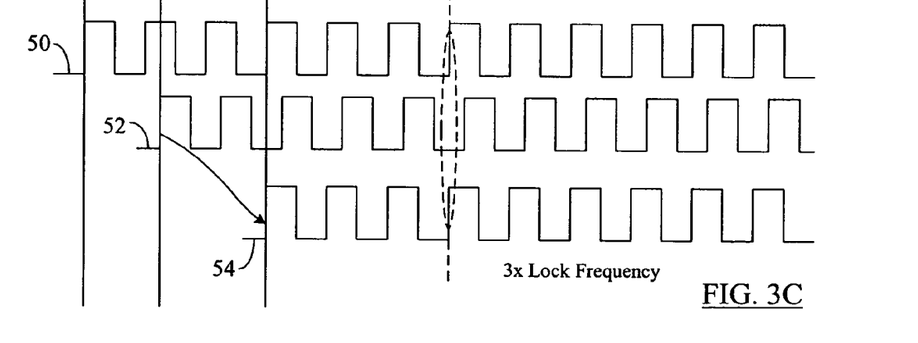

FIGS. 3A-3C illustrate an exemplary DLL locking mechanism through a set of clock signals according to one embodiment of the present disclosure. In FIG. 3A, a system clock 50 is shown having a first frequency. The system clock 50 may be analogized with the system clock 36 in FIG. 2. It is noted that in the absence of any DLL in the system, the system clock 50 may encounter a clock delay designated as delay "A" in FIG. 3A. This delay "A" may include, for example, the delay imparted by one or more clock driver buffers (e.g., the clock buffer 37 in FIG. 2) as well as delays in further distribution of the clock signal to internal circuit elements in an electronic device. For example, in case of a memory device without a DLL, this delay "A" may also include the delay in the clock distribution network 42 in FIG. 2 and other clock driver stages (not shown) before the clock signal is applied as the memory's internal clock to synchronize data input/output. When a DLL is present (as shown, for example, in FIG. 2), however, the DLL may introduce further forward path delay in the system clock 50 propagation. Such DLL-based delay is indicated as delay "B" in FIG. 3A. With reference to the DLL layout in FIG. 2, the delay "B" may include, at a minimum, the intrinsic delay ($t_{ID}$) in the delay line 38 as well as the total delay line buffer delay ($t_{buff}$) applied to the clock input to the delay line 38 before a DLL output clock is generated. It is observed that the clock delay "A" may remain fixed for all clock frequencies, whereas the DLL delay "B" may vary with the delay line input clock frequency (because the number of delay stages in the delay line 38 required to establish a lock may vary with the input clock frequency).

In FIG. 3A, for the sake of simplicity and ease of discussion, the clock waveform 52 is denoted as "DLL input" to indicate its intermediate status between the system clock 50 and a signal 54 which represents the timing of the memory output. Strictly speaking, the delay between the clock signal that is actually input to the delay line (e.g., the delay line 38 in FIG. 2) in the DLL and the system clock 50 may not be exactly equal to the clock delay "A." However, the overall delay between the system clock 50 and the signal 54 will equal the summation of the delays "A" and "B." In FIG. 3B, the system clock 50 has a second frequency, which is twice the frequency of the clock 50 in FIG. 3A. Similarly, the frequency of the clock 52 and the signal 54 is also twice the frequency of the corresponding clocks illustrated in FIG. 3A. On the other hand, the frequency of all the signals 50, 52 and 54 in FIG. 3C is three times the frequency of the corresponding signals 50, 52, and 54 in FIG. 3A. The clock frequency in FIG. 3A illustrates the initial clock frequency that is used to establish a lock condition, which is indicated by the alignment of the rising edges of the system clock 50 and the signal 54 at the time instance "tp." From all the waveforms in FIGS. 3A-3C, it is observed that when the DLL is locked at a low clock frequency (as in FIG. 3A), the DLL delay "B" required to force the signal 54 to line up with the system input clock 50 (similar to the system clock 36 in FIG. 2) remains fixed. In other words, the DLL delay "B" is no longer variable with clock frequency as long as the new clock frequency (e.g., the clock frequencies in FIG. 3B or 3C) is within the operating range of the electronic device (e.g., a DRAM memory chip) and is an integer multiple of the low frequency clock used to establish the initial DLL lock. The DLL remains locked at instance "tp" when the initial lock is established with the lowest desirable clock frequency and the other clock frequencies used in the system are integer multiples of the original, lower clock frequency.

Figure 4:
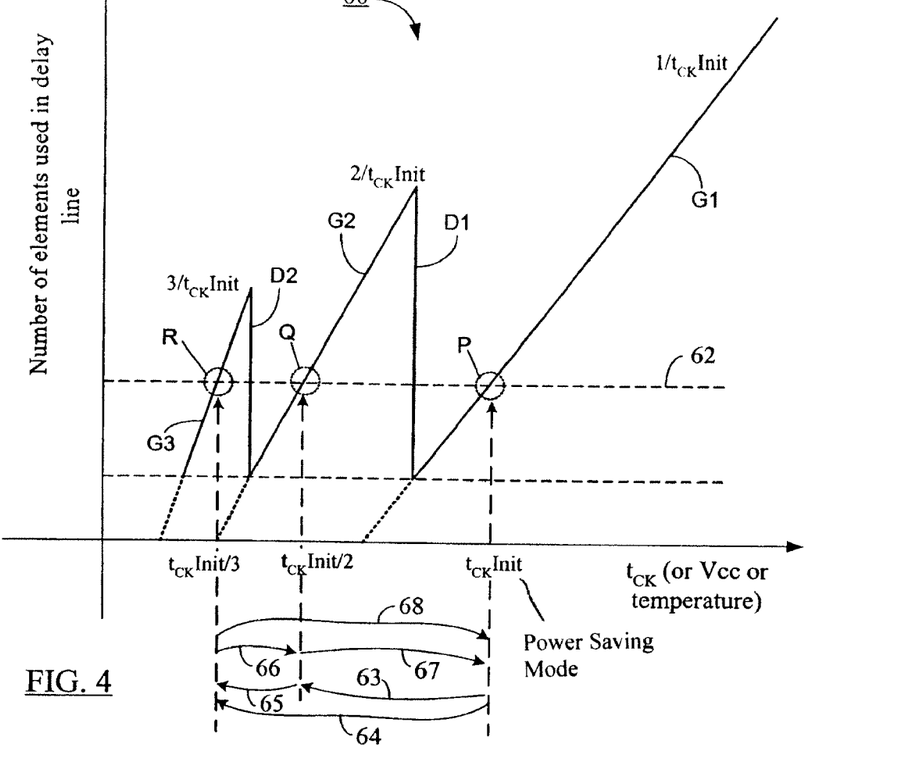
FIG. 4 depicts an exemplary DLL locking behavior plot at three different frequencies.

FIG. 4 depicts an exemplary DLL locking behavior plot 60 at three different frequencies. It is noted that such DLL locking behavior may be plotted for many different frequencies selected according to the teachings of the present disclosure. In the plot 60 in FIG. 4, the x-axis represents clock period of the system clock (e.g., the clock signal 50 in FIGS. 3A-3C), whereas the y-axis represents the number of delay line elements used in the DLL's delay line (e.g., the delay line 38 in FIG. 2) to establish a lock condition at a given clock period (or frequency) of the input system clock. It is seen from the plot 60 in FIG. 4 that when the initial lock (denoted as the lock point circle "P" in FIG. 4) is established at the slow clock frequency (represented by the clock period $t_{CK}$Init on the x-axis or the frequency $1/(t_{CK}$Init) for the corresponding DLL lock graph), and without any movement in the delay line in the DLL (i.e., without any change in the clock entry or clock exit point in the delay line), the DLL remains locked if the clock period is divided by an integer (i.e., the clock frequency is multiplied by an integer). This behavior is indicated by a dotted horizontal line 62 linking the three lock points "P", "Q", and "R" for three different system clock periods. The lock point "Q" relates to the system clock having half the clock period (denoted as $t_{CK}$Init/2 on the x-axis) of the clock used to establish the initial lock condition, whereas the lock point "R" relates to the system clock having one third of the initial clock period (denoted as $t_{CK}$Init/3 on the x-axis in FIG. 4). The horizontal alignment of the lock points "P", "Q", and "R" signifies that the number of elements used in the delay line of the DLL remains the same (i.e., the DLL remains locked) so long as the initial frequency (for establishing the lock) is substantially instantaneously switched or jumped (up or down) to an integer related frequency.

The vertical discontinuities D1 and D2 represent clock frequencies where the desired DLL lock point jumps by one clock period. For example, at clock period $t_{CK}$Init, the delay may be decreased along the G1 slope if less delay is needed due to variations in Vcc, $t_{CK}$ or temperature. If the needed delay reaches zero, (the G1 line intersects the horizontal axis), the DLL can no longer reduce the delay and the DLL will fail even though there is a valid operating point in the DLL delay line (along the G2 line). In the example of FIG. 4, frequency slewing from point $t_{CK}$Init/2 to point P is not possible because the DLL will hit the minimum delay end of the delay line. Likewise, because the delay elements are used rapidly for DLL loop delays that are high multiples of $t_{CK}$, it is not possible to slew from operating point R to point P because the delay line will not be long enough to provide the added delay required as the operating point climbs along line G3 in an attempt to reach an intersection of the vertical $t_{CK}$Init line.

It is noted that the x-axis in FIG. 4 may also be used to represent the changes in the supply voltage (Vcc) of the DLL input clock or the variations in the temperature of the DLL. Thus, the DLL lock behavior plots (e.g., the plots G1, G2, and G3) may be used to figure out how voltage or temperature variations of the DLL's input clock would affect the DLL lock stability.

As noted before, in the past, systems have attempted to save power by slowly slewing the system clock frequency. This, however, adds significant complexity to the system clock generator and, because the slewing occurs along the same lock point line (e.g., the line G1 or G2 or G3, as applicable), the minimum and maximum clock period variations ($t_{CK}$min/max) for a given lock point plot (G1, G2, or G3) are severely limited. This limitation is exaggerated (as indicated by the steeper slopes) if the system locks on N=3 (i.e., the new frequency is three times higher than the initial locking frequency $1/t_{CK}$Init) or greater (these plots are not shown in FIG. 4). For example, as discussed before, in case of the plot G3 (N=3), a relatively small amount of clock period fluctuations are accommodated in the delay line because the delay line is "used" N times (N=3) as quickly when N times more clock cycles are present inside the delay line. However, as noted before, if the system is designed to initialize at a slow frequency (e.g., the frequency $1/t_{CK}$Init for plot G1 in FIG. 4) and then substantially instantaneously "jump" or switch to an integer-multiplied frequency, the DLL remains locked. This approach may greatly simplify the clock generator design (can be a simple divide-by-N clock generator), allow for faster frequency changes, and may not further constrain the $t_{CK}$min/max of the system.

In FIG. 4, various arrows 63-68 illustrate how system clock frequency may be instantaneously changed without altering the DLL lock point. For example, when the initial lock is established at $t_{CK}$Init, the clock period may be switched from $t_{CK}$Init to $t_{CK}$Init/2 (arrow 63) or to $t_{CK}$Init/3 (arrow 64). Also, once the DLL is initially locked at a slow frequency (long clock period $t_{CK}$), the clock periods may be substantially instantaneously switched from, for example, $t_{CK}$Init/2 to $t_{CK}$Init/3 (arrow 65) and vice versa (arrow 66), i.e., back to the initial clock period $t_{CK}$Init (arrow 67-68). Thus, although the switching from $t_{CK}$Init/2 to $t_{CK}$Init/3 is not to an integer-divided clock period (3/2=1.5), the switching may not affect the DLL lock point (as indicated by the horizontal movement of the lock point from location "Q" to "R" in FIG. 4) because each of the clock periods involved here is an integer-divided version of the original clock period $t_{CK}$Init at which the DLL was initially locked. It is noted here that when the system clock frequency is switched from half frequency (e.g., during a power down mode) to full frequency (e.g., during a normal operation mode), for example, the phase detector (similar to the phase detector 40 in FIG. 2) in the DLL may register a no-lock condition. However, this condition may be "filtered" out by the DLL's majority filter (not shown) and no lock point shift will occur due to the instantaneous frequency change. This DLL locking behavior thus allows for rapid clock speed changes (either to speed up or to slow down) and quick switching between device's normal operation mode frequency (higher frequency) and the power down mode frequency (which can be the low frequency used to establish the initial DLL lock). It is evident to one skilled in the art that only three frequencies are illustrated in FIG. 4. However, the frequency of the system clock may be further increased (e.g., to $4*1/t_{CK}$Init or to $5*1/t_{CK}$Init or higher) so long as the new frequency is an integer-multiplied version of the original slow frequency used for the DLL's initial lock.

Figure 5:
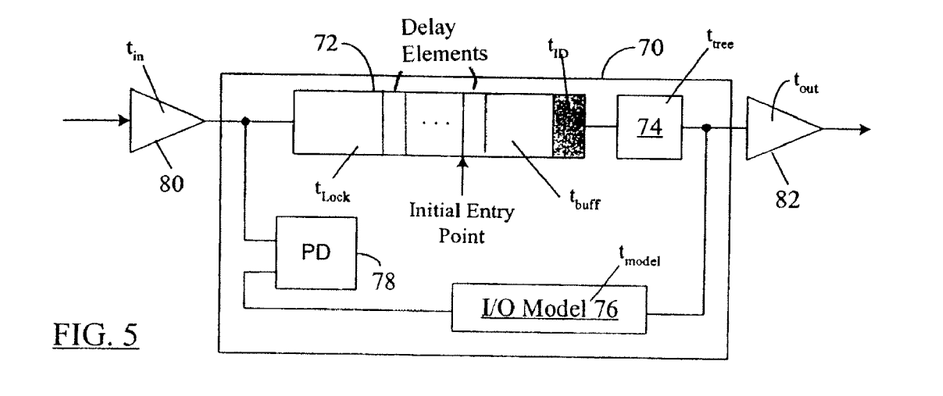
FIG. 5 shows a simplified block diagram of an exemplary DLL unit illustrating various time delays associated therewith.

FIG. 5 shows a simplified block diagram of an exemplary DLL unit 70 illustrating various time delays associated therewith. The simplified model of the DLL unit 70 is shown to include a delay line unit 72 (similar to the delay line 38 in FIG. 2), a clock tree circuit 74 (similar to the clock distribution network 42 in FIG. 2), an I/O model unit 76 (similar to the I/O model circuit 44 in FIG. 2) and a phase detector 78 (similar to the phase detector 40 in FIG. 2). The delays associated with each circuit block in FIG. 5 are also indicated. For example, the clock tree circuit 74 may impart a delay of $t_{tree}$ to a clock signal input thereto, and so on. Additional circuit elements for the DLL 70 are not illustrated for the sake of clarity and ease of discussion. Furthermore, because of the substantial similarity between various circuit blocks in FIGS. 2 and 5, the operation of various DLL component blocks in FIG. 5 is not discussed herein for the sake of brevity. A system clock input buffer 80 (and its associated delay $t_{in}$) and an output driver buffer 82 (and its associated delay $t_{out}$) for the output clock at the clock tree circuit 74 are also shown in FIG. 5. It is seen from FIG. 5 that the delay encountered by the input system clock in the "dynamic" portion of the delay line 72 is represented by the parameters $t_{Lock}$ and $t_{buff}$. If the delay line 72 is shifted all the way to the right after DLL initialization, the minimum or "zero tap delay" would equal the intrinsic delay $(t_{ID})$ of the delay line itself. It is observed that $t_{ID}$ may include any fine delay overhead, and any input and output delays specific to the DLL 70. The minimum forward path delay encountered by a system clock with the DLL 70 inserted in the system may be given by:

$$t_{FPmin} = t_{in} + t_{ID} + t_{tree} + t_{out} \quad (1)$$

The DLL buffer stages (with associated delay $t_{buff}$) (not shown) may allow the system to lock with the minimum $t_{Lock}$ and to still be able to shift to the right (in the delay line 72) when needed. These buffer stages may cover temperature changes and fluctuations or changes in the supply voltage Vcc, but may not cover dynamic frequency shifts in the system clock input thereto. However, as discussed later hereinbelow with reference to FIGS. 7A-7B, the integer-multiplied frequency switching methodology according to the teachings of the present disclosure may be implemented with the existing buffer stages without requiring any re-design or modification of such buffer stages.

Figure 6:
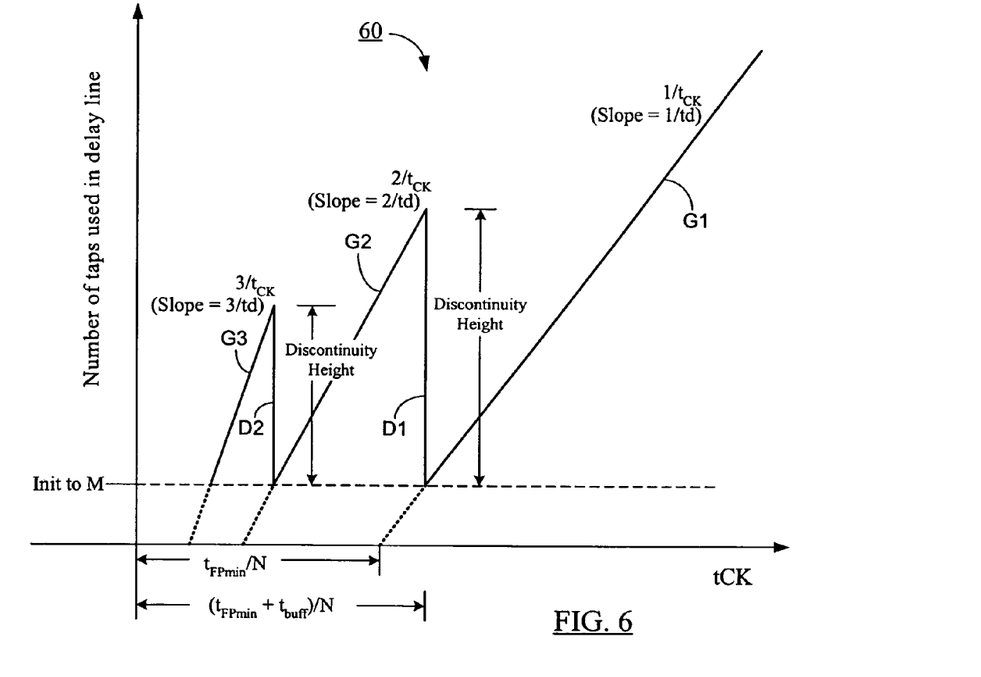
FIG. 6 illustrates the DLL locking behavior plot in FIG. 4 marked with various measurement parameters.

FIG. 6 illustrates the DLL locking behavior plot 60 in FIG. 4 marked with various measurement parameters. In various equations given hereinbelow, the following parameter definitions apply:

N=the integer number of clocks in a DLL loop (e.g., the DLL 70 in FIG. 5);
$t_d$=coarse delay per delay line stage;
$t_{ID}$=minimum delay line delay (or the intrinsic delay as shown in FIG. 5);
$t_{FPmin}$=minimum forward path delay as given hereinbefore in equation (1);
M=integer number of delay line buffer delays/stages (or taps);
T=total delay line delay stages (including buffer delays);
$t_{buff}$=M*$t_d$ ($t_{buff}$ delay is illustrated in FIG. 5); and
$N_{min}$=lower value of N at a given discontinuity in the plot in FIG. 6.

The initial delay line clock entry point (shown in FIG. 5) may be set at "M" number of delay line taps as shown by the horizontal notation on the y-axis in FIG. 6. The parameter N may be given by the following integer value equation:

$$N = INT(t_{CK}/t_{model}) + 1 \quad (2)$$

where $t_{CK}$ is the clock period of the system clock input to the DLL unit (e.g., the DLL 70 in FIG. 5) and $t_{model}$ is the delay provided in the I/O model unit (e.g., the I/O model 76 in FIG. 5). The variable delay line delay (including delay line buffer delay $t_{buff}$) may be given by:

$$\text{Variable delay line delay} = N * t_{CK} - t_{FPmin} = \frac{t_{CK} - \text{MOD}(t_{CK}, t_{model})}{t_d} \quad (3)$$

The total number of delays required (including delay line buffer stages) may be given by:

$$T = \frac{N \cdot t_{CKmax} - t_{FPmin}}{t_d} \quad (4)$$

where $t_{CKmax}$ is the maximum system clock period (on x-axis) that may be supported by the DLL 70 on loop delay N for a given plot (e.g., any of the plots G1-G3 in FIG. 6). The slope of each plot G1-G3 in FIG. 6 may equal N/$t_d$. Thus, if N=1 for the lowest clock frequency plot G1, then the slope of plot G1 is 1/$t_d$, whereas the slopes of plots G2 and G3 would be 2/$t_d$ and 3/$t_d$, respectively, as indicated in FIG. 6. The location (on the negative y-axis) of the singular point at which all of the lines G1-G3 intercept the y-axis may be given by:

$$Y \text{ intercept of all lines} = -\frac{t_{FPmin}}{t_d} \quad (5)$$

It is observed here that all of the plots G1-G3 may intercept at the same location on the negative y-axis because the location of the y-axis intercept is not influenced by $t_{buff}$ (as opposed to the location of an x-axis intercept which is given hereinbelow). The discontinuity location or the position on x-axis where a discontinuity (e.g., the discontinuity D1 or D2 in FIG. 6) intercepts the x-axis may be given by:

$$\text{Discontinuity Location} = \frac{t_{FPmin} + t_{buff}}{N_{min}} \quad (6)$$

The height of a discontinuity (e.g., the discontinuity D1 or D2 in FIG. 6) may be given by:

$$\text{Discontinuity Height} = \frac{t_{FPmin}}{t_d \cdot N_{min}} \quad (7)$$

The minimum system clock period (on x-axis) that may be supported by the DLL 70 on loop delay N for a given plot (e.g., any of the plots G1-G3 in FIG. 6) can be given by:

$$t_{CKmin} = \frac{t_{FPmin}}{N} \quad (8)$$

Figure 7A:
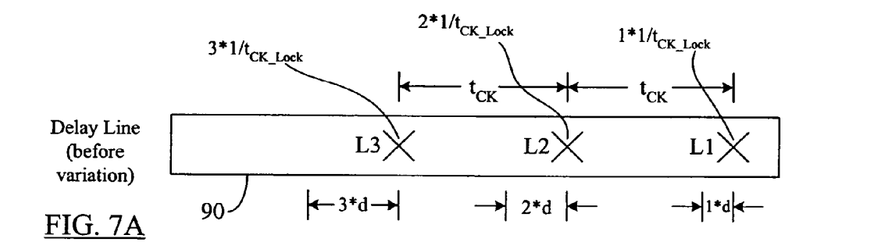
FIGS. 7A and 7B depict how a parameter variation (which could be a shift in $t_{CK}$, Vcc, or temperature) translates into the corresponding movement of the lock point for different system clock frequencies so long as the clock frequencies are in integer multiples of the slowest system clock as per the teachings of the present disclosure.
Figure 7B:
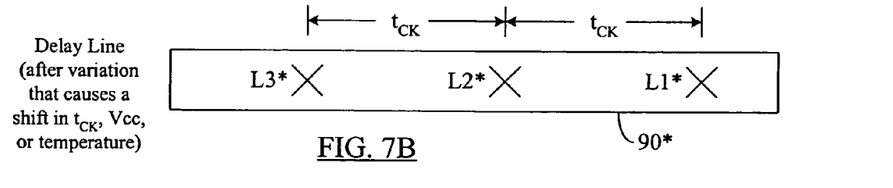

It is seen in FIG. 6 that the motion along the plots G2 and G3 is faster (steeper slope) in the delay line (e.g., the delay line 72 in FIG. 5) when the loop delay multiple, N, is greater than one. That is, a given change (which could be a shift in $t_{CK}$, Vcc, or temperature along the x-axis) that causes the lock point to move a specific distance along the slow frequency plot G1 results in the lock point moving by N times that distance along the higher slope plots G2 or G3. FIGS. 7A and 7B depict how a parameter variation (which could be a shift in $t_{CK}$, Vcc, or temperature) translates into the corresponding movement of the lock point for different system clock frequencies so long as the clock frequencies are in integer multiples of the slowest system clock as per the teachings of the present disclosure. FIG. 7A shows a simplified view of a delay line 90 and its lock point locations before any parameter variation is encountered. In FIG. 7A, three lock points L1, L2, and L3 relate to corresponding system clock locking frequencies 1/$t_{CK\_Lock}$, 2/$t_{CK\_Lock}$, and 3/$t_{CK\_Lock}$. As discussed before, the higher frequencies are integer-multiplied versions of the slowest frequency 1/$t_{CK\_Lock}$. Each possible lock point L1-L3 in the delay line 90 is exactly one $T_{CK\_lock}$ clock period away from the next. If, for example, some variation (in input system clock period $t_{CK}$, voltage Vcc, or temperature) causes the right-most lock L1 to move to the left by some delay "d", then the next valid lock point L2 moves by that same original variation (=d) plus the amount required to maintain each lock point separated by one clock period. Thus, the total left shift of the lock point L2 equals "2*d" to maintain the one clock period ($t_{CK}$) separation between locations of L1 and L2. Similarly, the lock point L3 moves to the left by an amount equal to "3*d" to maintain the $t_{CK}$ separation between L2 and L3. The new locations of lock points L1-L3 are indicated as L1*, L2*, and L3*, respectively, in the "new" delay line 90* shown in FIG. 7B. Thus, it is seen from FIGS. 7A and 7B that when initial DLL locking is performed at a slow clock frequency according to the teachings of the present disclosure, any subsequent frequency switching (to an integer-multiplied clock frequency) may result in a lock point scaling behavior in the delay line rather than a simple shift of all valid lock points by an identical amount. The scaling behavior allows the DLL to maintain the lock condition despite the substantially instantaneous frequency switch.

Figure 8:
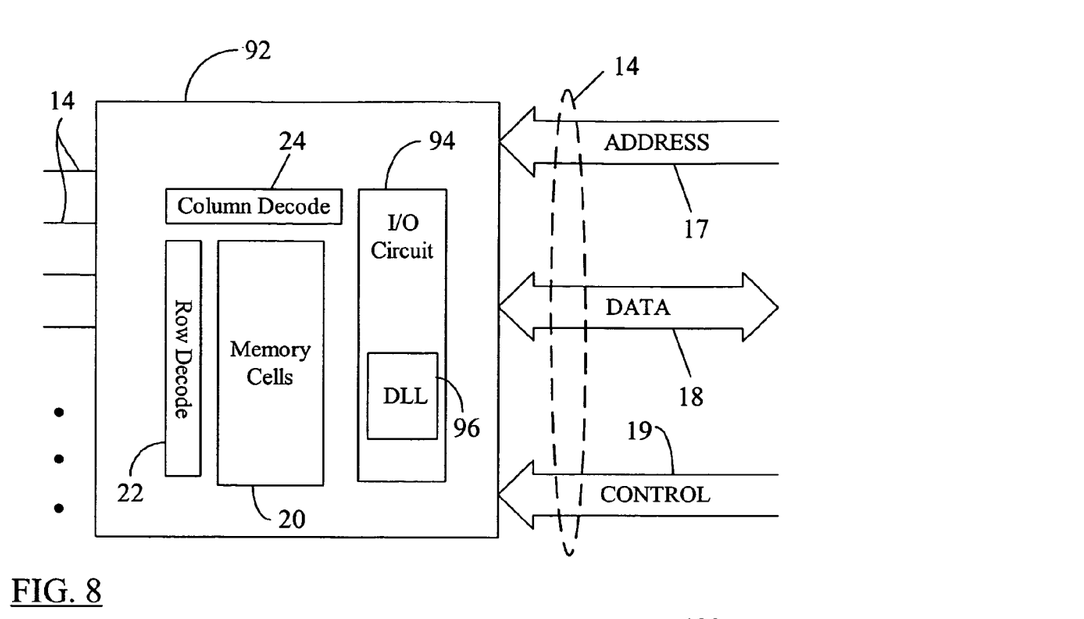
FIG. 8 is a simplified block diagram showing a memory chip that employs a DLL as part of an I/O circuit, wherein the DLL is locked according to the teachings of the present disclosure.

FIG. 8 is a simplified block diagram showing a memory chip 92 that employs a DLL 96 as part of an I/O circuit 94, wherein the DLL 96 is locked according to the teachings of the present disclosure. The DLL 96 may be similar in construction to the DLL 70 illustrated in FIG. 5. However, it will be evident to one skilled in the art that, to be operational, DLL 96 may also contain additional circuit elements than those shown in the simplified block diagram in FIG. 5. Further, as per the teachings of the present disclosure, the DLL 96 may be initially locked at a slower clock frequency during a power saving mode, but during normal memory operation, the operating frequency may be selected to be an integer multiple of the initial lock frequency so as to maintain the lock condition while frequencies are switched substantially instantaneously. The memory chip 92 can be a dynamic random access memory (DRAM) or another type of memory circuits such as SRAM (Static Random Access Memory) or Flash memories. Furthermore, the DRAM could be a synchronous DRAM commonly referred to as SGRAM (Synchronous Graphics Random Access Memory), SDRAM (Synchronous Dynamic Random Access Memory), SDRAM II, or DDR SDRAM (Double Data Rate SDRAM), as well as Synchlink or Rambus DRAMs. In one embodiment, the memory chip 92 is a DDR DRAM operating at a clock frequency of 333 MHz and an I/O data rate of 667 MHz. It is noted here that although other elements in the memory chip 92 are designated with the same reference numerals as those given in FIG. 1, it may be possible that those components having same reference numerals may not be identical in construction in the memories 12 and 92. However, for the sake of simplicity, units with similar functionality are denoted by same reference numerals in FIGS. 1 and 8.

Figure 9:
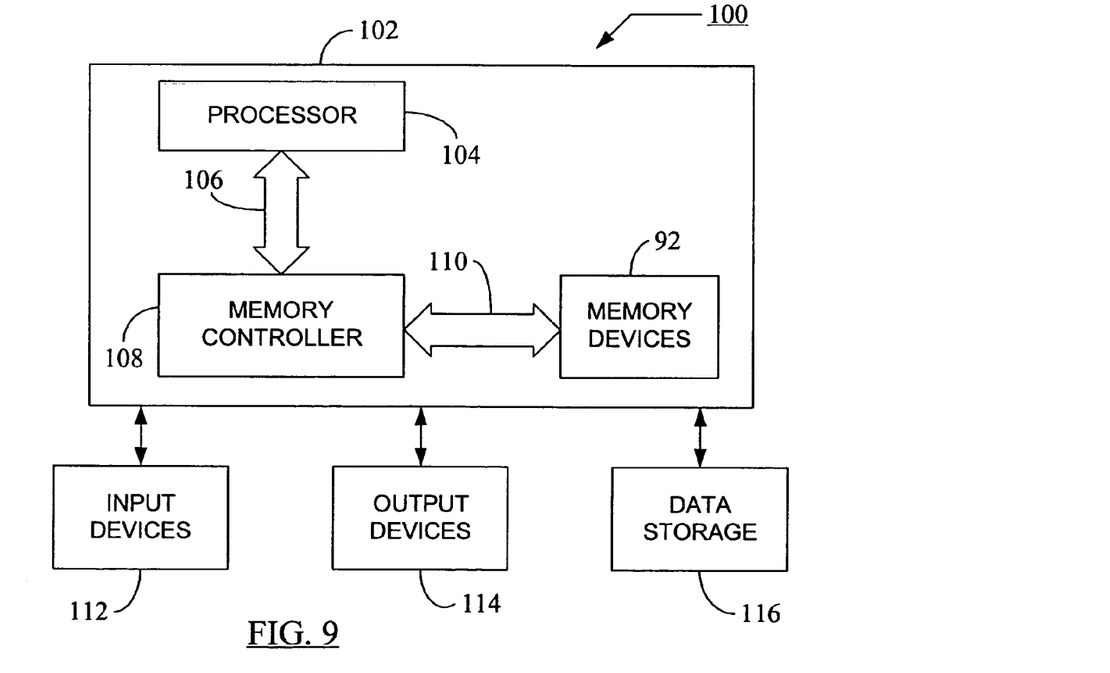
FIG. 9 is a block diagram depicting a system in which one or more memory chips illustrated in FIG. 8 may be used.

FIG. 9 is a block diagram depicting a system 100 in which one or more memory chips 92 illustrated in FIG. 8 may be used. The system 100 may include a data processing unit or computing unit 102 that includes a processor 104 for performing various computing functions, such as executing specific software to perform specific calculations or data processing tasks. The computing unit 102 also includes a memory controller 108 that is in communication with the processor 104 through a bus 106. The bus 106 may include an address bus (not shown), a data bus (not shown), and a control bus (not shown). The memory controller 108 is also in communication with a set of memory devices 92 (i.e., multiple memory chips 92 of the type shown in FIG. 8) through another bus 110 (which may be similar to the bus 14 shown in FIG. 8). Each memory device 92 may include appropriate data storage and retrieval circuitry (not shown in FIG. 9) as shown in FIG. 8. The processor 104 can perform a plurality of functions based on information and data stored in the memories 92.

The memory controller 108 can be a microprocessor, digital signal processor, embedded processor, micro-controller, dedicated memory test chip, a tester platform, or the like. The memory controller 108 may control routine data transfer operations to/from the memories 92, for example, when the memory devices 92 are part of an operational computing system 102. In one embodiment, the memory controller 108 may also provide appropriate system clocks (e.g., system clocks of integer-multiplied frequencies x, 2x, 3x, etc.) to the I/O circuit 94 (FIG. 8) so as to establish and maintain the lock conditions in the DLL 90 as per the teachings of the present disclosure. The memory controller 108 may reside on the same motherboard (not shown) as that carrying the memory chips 92. Various other configurations of electrical connection between the memory chips 92 and the memory controller 108 may be possible. For example, the memory controller 108 may be a remote entity communicating with the memory chips 92 via a data transfer or communications network (e.g., a LAN (local area network) of computing devices).

The system 100 may include one or more input devices 112 (e.g., a keyboard or a mouse) connected to the computing unit 102 to allow a user to manually input data, instructions, etc., to operate the computing unit 102. One or more output devices 114 connected to the computing unit 102 may also be provided as part of the system 100 to display or otherwise output data generated by the processor 104. Examples of output devices 114 include printers, video terminals or video display units (VDUs). In one embodiment, the system 100 also includes one or more data storage devices 116 connected to the data processing unit 102 to allow the processor 104 to store data in or retrieve data from internal or external storage media (not shown). Examples of typical data storage devices 116 include drives that accept hard and floppy disks, CD-ROMs (compact disk read-only memories), and tape cassettes. As noted before, the memory devices 92 in the computing unit 102 have the configuration illustrated in FIG. 8, i.e., each memory device 92 includes an I/O circuit 94 that accomplishes power savings via frequency switching in the DLL 96 as per the teachings of the present disclosure.

It is observed that although the discussion given hereinbefore has been primarily with reference to memory devices, it is evident that the integer-multiplied frequency switching methodology discussed hereinbefore with reference to FIGS. 3-7 may be employed, with suitable modifications which will be evident to one skilled in the art, in any non-memory electronic device that may utilize a DLL or a similar DLL-type clock synchronization circuit. Thus, power savings in non-memory electronic devices may also be obtained through the selective frequency switching discussed hereinbefore.

The foregoing describes a system and method to accomplish power savings in an electronic device, such as a memory chip, by performing selective frequency locking and subsequent instantaneous frequency switching in the DLL (delay locked loop) used for clock synchronization in the electronic device. By locking the DLL at a slow clock frequency, the operational frequency may be substantially instantaneously switched to an integer-multiplied frequency of the initial locking frequency without losing the DLL lock point. This allows for faster frequency changes from higher (during normal operation) to lower (during a power saving mode) clock frequencies without resorting to gradual frequency slewing to conserve power and maintain DLL locking. Hence, a large power reduction may be accomplished substantially instantaneously without adding complexity to the system clock generator.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. A method, comprising:
supplying an input clock having a first clock frequency representative of a power saving mode of operation;
locking an output clock produced by a delay locked loop comprised of a plurality of delay elements to said input clock, said input and output clocks having the same frequency; and
substantially instantaneously switching the clock frequency of said input clock from said first clock frequency to a second clock frequency that is representative of an operational mode, said second clock frequency being related to the first clock frequency by an integer value such that a number of operational delay elements remains the same so as to maintain the lock between said input clock and said output clock.

2. The method of claim 1, further comprising substantially instantaneously switching from one of said first or second clock frequencies to a third clock frequency, wherein said third clock frequency is related to the first clock frequency by an integer value such that said number of operational delay elements remains the same so as to maintain the lock between said input clock and said output clock.

3. The method of claim 2 wherein said first clock frequency is lower than said second clock frequency, and said second clock frequency is lower than said third clock frequency.

4. The method of claim 2 wherein said third clock frequency is greater than said first clock frequency and lower than said second clock frequency.

5. A method, comprising:
supplying an input clock having a first clock frequency representative of a power saving mode of operation;
locking an output clock produced by a delay locked loop comprised of a plurality of delay elements to said input clock, said input and output clocks having the same frequency; and
switching the clock frequency of said input clock from said first clock frequency to a second clock frequency without slewing, wherein said second clock frequency is representative of an operational mode and is related to the first clock frequency by an integer value such that a number of operational delay elements remains the same so as to maintain the lock between said input clock and said output clock.

6. The method of claim 5, further comprising switching from said second clock frequency to a third clock frequency, wherein said third clock frequency is related to the first clock frequency by an integer value such that said number of operational delay elements remains the same so as to maintain the lock between said input clock and said output clock.

7. A method of operating a delay locked loop, comprising:
supplying an input clock having a first clock frequency;
establishing a lock condition between said input clock and an output clock produced by a delay locked loop comprised of a plurality of delay elements, said input and output clocks having the same frequency; and
substantially instantaneously switching the clock frequency of said input clock from said first clock frequency to a second clock frequency such that a number of operational delay elements remains the same and without losing said lock condition.

8. The method of claim 7, further comprising substantially instantaneously switching from said first clock frequency to a third clock frequency without losing said lock condition, and wherein said third clock frequency is related to the first clock frequency by an integer value such that said number of operational delay elements remains the same.

9. The method of claim 8 wherein said first clock frequency is lower than said second clock frequency, and said second clock frequency is lower than said third clock frequency.

10. The method of claim 8 wherein said third clock frequency is greater than said first clock frequency and lower than said second clock frequency.

* * * * *